(12) United States Patent
Ravindran et al.

(10) Patent No.: US 12,602,419 B1
(45) Date of Patent: Apr. 14, 2026

(54) MACHINE LEARNING-BASED PROCESSING OF LOGS CONTAINING UNSTRUCTURED TEXT DATA

(71) Applicant: Dell Products L.P., Round Rock, TX (US)

(72) Inventors: Praveen Prabha Ravindran, Austin, TX (US); John Hickie, Dublin (IE)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 19/198,882

(22) Filed: May 5, 2025

(51) Int. Cl.
| | |
|---|---|
| *G06F 16/30* | (2019.01) |
| *G06F 16/34* | (2019.01) |
| *G06F 16/35* | (2019.01) |
| *G06F 30/27* | (2020.01) |
| *G06N 3/0455* | (2023.01) |
| *G06N 20/00* | (2019.01) |
| *G06F 11/34* | (2006.01) |

(Continued)

(52) U.S. Cl.
CPC ............ *G06F 16/345* (2019.01); *G06F 16/35* (2019.01); *G06F 30/27* (2020.01); *G06N 3/0455* (2023.01); *G06N 20/00* (2019.01); *G06F 11/3409* (2013.01); *G06F 11/3447* (2013.01); *G06F 30/20* (2020.01); *G06N 3/02* (2013.01); *G06N 3/0475* (2023.01)

(58) Field of Classification Search
CPC .... G06F 16/345; G06F 16/35; G06F 11/3409; G06F 11/3447; G06F 30/20; G06F 30/27; G06N 3/02; G06N 3/0455; G06N 3/0475; G06N 20/00
See application file for complete search history.

(56) References Cited

U.S. PATENT DOCUMENTS

| | | | |
|---|---|---|---|
| 2023/0252478 A1* | 8/2023 | Saleh | G06Q 20/4016 705/44 |
| 2024/0303174 A1* | 9/2024 | Sethi | G06F 11/3409 |
| 2025/0238300 A1* | 7/2025 | Levy | G06N 3/084 |

OTHER PUBLICATIONS

Y. Januzaj, et al., "Determining the Optimal Number of Clusters Using Silhouette Score As A Data Mining Technique," https://doi.org/10.3991/ijoe.v19i04.37059, International Journal of Online and Biomedical Engineering, vol. 19, No. 4, Apr. 3, 2023, 174-182 pp.

(Continued)

*Primary Examiner* — Diedra McQuitery
(74) *Attorney, Agent, or Firm* — Ryan, Mason & Lewis, LLP

(57) ABSTRACT

An apparatus comprises at least one processing device configured to obtain logs comprising unstructured text data characterizing issues encountered on information technology assets, to generate, utilizing a transformer-based machine learning model, embeddings for the logs, to select, based on cluster validation metrics determined by processing the embeddings, a target number of clusters, and to determine, utilizing a machine learning-based clustering model that takes as input the target number of clusters, a set of clusters. The at least one processing device is also configured to determine a prioritization of the encountered issues based on identifying associations between respective ones of the clusters and at least one of applications executing on the information technology assets and users of the applications. The at least one processing device is further configured to remediate the encountered issues based on the determined prioritization.

20 Claims, 18 Drawing Sheets

(51) Int. Cl.

| | | |
|---|---|---|
| G06F 30/20 | (2020.01) | |
| G06N 3/02 | (2006.01) | |
| G06N 3/0475 | (2023.01) | |

(56) References Cited

OTHER PUBLICATIONS

"Sentence-Transformers/all-MiniLM-L6-v2," https://huggingface.co/sentence-transformers/all-MiniLM-L6-v2, Apr. 23, 2025.

* cited by examiner

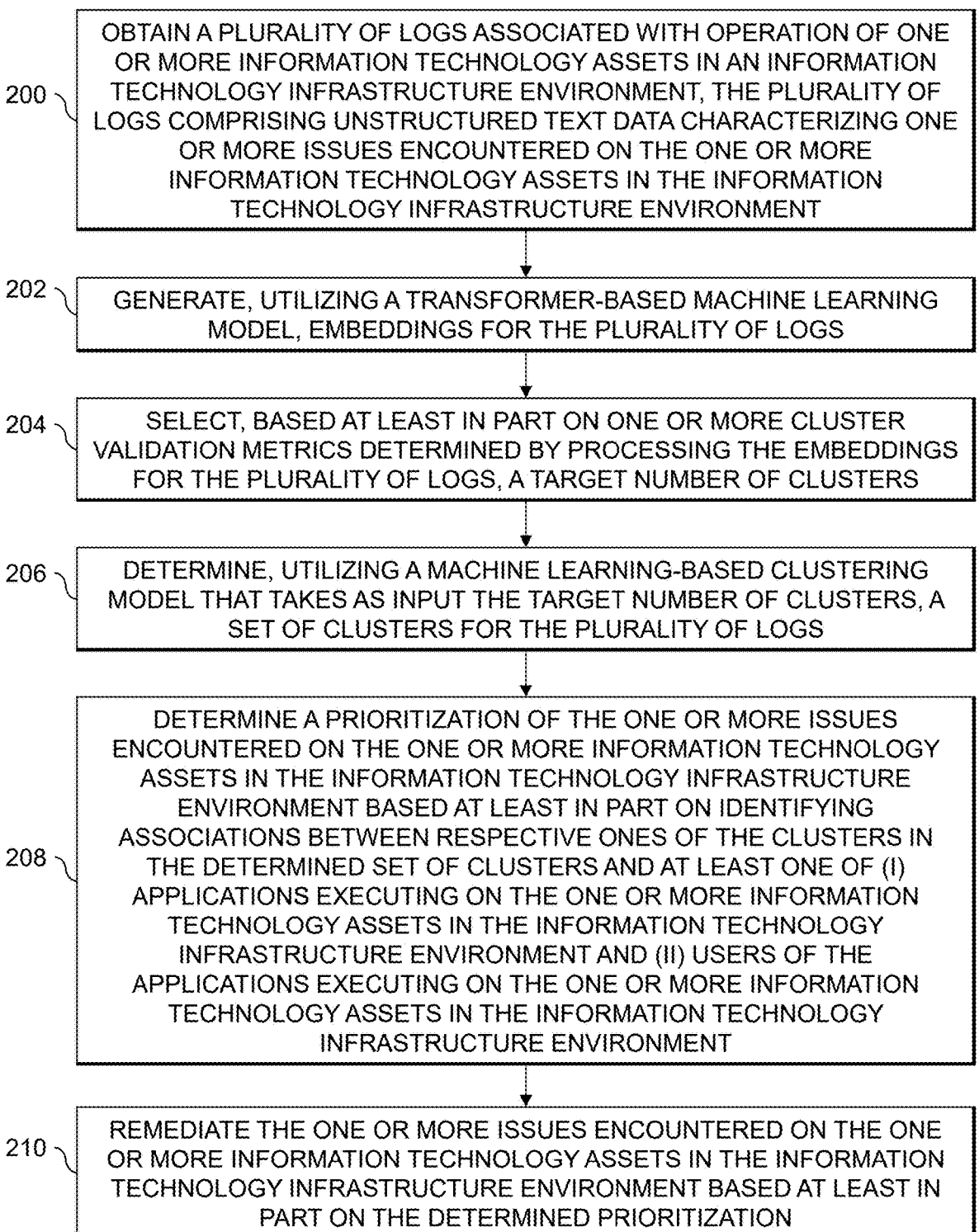

200 — OBTAIN A PLURALITY OF LOGS ASSOCIATED WITH OPERATION OF ONE OR MORE INFORMATION TECHNOLOGY ASSETS IN AN INFORMATION TECHNOLOGY INFRASTRUCTURE ENVIRONMENT, THE PLURALITY OF LOGS COMPRISING UNSTRUCTURED TEXT DATA CHARACTERIZING ONE OR MORE ISSUES ENCOUNTERED ON THE ONE OR MORE INFORMATION TECHNOLOGY ASSETS IN THE INFORMATION TECHNOLOGY INFRASTRUCTURE ENVIRONMENT

202 — GENERATE, UTILIZING A TRANSFORMER-BASED MACHINE LEARNING MODEL, EMBEDDINGS FOR THE PLURALITY OF LOGS

204 — SELECT, BASED AT LEAST IN PART ON ONE OR MORE CLUSTER VALIDATION METRICS DETERMINED BY PROCESSING THE EMBEDDINGS FOR THE PLURALITY OF LOGS, A TARGET NUMBER OF CLUSTERS

206 — DETERMINE, UTILIZING A MACHINE LEARNING-BASED CLUSTERING MODEL THAT TAKES AS INPUT THE TARGET NUMBER OF CLUSTERS, A SET OF CLUSTERS FOR THE PLURALITY OF LOGS

208 — DETERMINE A PRIORITIZATION OF THE ONE OR MORE ISSUES ENCOUNTERED ON THE ONE OR MORE INFORMATION TECHNOLOGY ASSETS IN THE INFORMATION TECHNOLOGY INFRASTRUCTURE ENVIRONMENT BASED AT LEAST IN PART ON IDENTIFYING ASSOCIATIONS BETWEEN RESPECTIVE ONES OF THE CLUSTERS IN THE DETERMINED SET OF CLUSTERS AND AT LEAST ONE OF (I) APPLICATIONS EXECUTING ON THE ONE OR MORE INFORMATION TECHNOLOGY ASSETS IN THE INFORMATION TECHNOLOGY INFRASTRUCTURE ENVIRONMENT AND (II) USERS OF THE APPLICATIONS EXECUTING ON THE ONE OR MORE INFORMATION TECHNOLOGY ASSETS IN THE INFORMATION TECHNOLOGY INFRASTRUCTURE ENVIRONMENT

210 — REMEDIATE THE ONE OR MORE ISSUES ENCOUNTERED ON THE ONE OR MORE INFORMATION TECHNOLOGY ASSETS IN THE INFORMATION TECHNOLOGY INFRASTRUCTURE ENVIRONMENT BASED AT LEAST IN PART ON THE DETERMINED PRIORITIZATION

```
Exception:System.NullReferenceException: Object reference not set to an instance of an
object.
at
Project.Module.Component.ServiceA.HandlerA.Execute(RequestA
requestA) in
/builds/project/module/component/serviceA/HandlerA.cs:line 194
at Project.Module.API.Workflow.Coordinator.StepOne(PathA
pathA, RequestA requestA) in
/builds/project/module/component/serviceA/API/Workflow/Coordinator.cs:line 184
at
Project.Module.API.Workflow.BaseCoordinator.StepTwo(PathA pathAFinder, RequestA
requestA) in
/builds/project/module/component/serviceA/API/Workflow/BaseCoordinator.cs:line 582
at
Project.Module.API.Workflow.Coordinator.StepThree(PathA
pathA, RequestA requestA) in
/builds/project/module/component/serviceA/API/Workflow/Coordinator.cs:line 17
...
...
...
```

FIG. 5

600 httprequesterror statuscode null message unable perform merge quote operation request parentquoteid fx shrinokaykgf nec ua quoteidstobemerged fx shrinokaykgf nec ua skipcombinesshipment true title snapshot service return error status detail application try perform multiple action parallel fail error errormessage error merge quote quoteid fx shrinokaykgf nec ua detail application try perform multiple action parallel fail error errormessage error try copy snapshot reference url http snapshot

```
...
def _build_encoder(self) -> tf.keras.Sequential:
    """
    Build the encoder part of the autoencoder.

:return: The encoder model.
    """
    return tf.keras.Sequential([
        tf.keras.layers.InputLayer(input shape=(self.input dim,), name='input layer'),
        tf.keras.layers.Dense(self.encoding_dim, activation='tanh', name='encoder_tanh_dense_1'),
        tf.keras.layers.BatchNormalization(iname='iencoder_batch_norm_1'),
        tf.keras.layers.Dropout(self.dropout rate, name=f'encoder dropout {self.dropout rate} 1'),
        tf.keras.layers.Dense(int(self.encoding_dim / 2), activation='tanh', name='encoder_tanh_dense_2')
    ], name='encoder')

def _build_decoder(self) -> tf.keras.Sequential:
    """
    Build the decoder part of the autoencoder.

:return: The decoder model.
    """
    return tf.keras.Sequential([
        tf.keras.layers.Dense(int(self.encoding.dim / 2), activation='tanh', name='decoder_tanh_dense_1),
        tf.keras.layers.BatchNormalization(name='decoder batch norm 1'),
        tf.keras.layers.Dropout(self.dropout_rate, name=f'decoder_dropout_{self.dropout_rate}_1),
        tf.keras.layers.Dense(self.input_dum, activation='linear', name='decoder_linear_dense_2')
    ], name='decoder')
...
```

```
Search: Running Trial #5

Value          | Best Value So Far | Hyperparameter
122            | 122               | encoding_dim
0.2            | 0.4               | dropout_rate
4.06e-05       | 0.000102          | learning_rate Autoencoder input parameters: input_dim=100, encoding_dim=122, dropout_rate=0.2,
learning_rate=4.059999358516054e-05

Epoch 1/15
339/339 -------------- 2s 3ms/step — loss: 0.3579 — val_loss: 0.0532
Epoch 2/15
339/339 -------------- 1s 2ms/step — loss: 0.0408 — val_loss: 0.0192
Epoch 3/15
339/339 -------------- 1s 2ms/step — loss: 0.0204 — val_loss: 0.0155
Epoch 4/15
339/339 -------------- 1s 2ms/step — loss: 0.0118 — val_loss: 0.0098
Epoch 5/15
339/339 -------------- 1s 2ms/step — loss: 0.0100 — val_loss: 0.0084
Epoch 6/15
...
339/339 -------------- 1s 2ms/step — loss: 0.0054 — val_loss: 0.0052
Epoch 9/15
339/339 -------------- 1s 3ms/step — loss: 0.0053 — val_loss: 0.0046
Epoch 10/15
339/339 -------------- 0s 1ms/step — loss: 0.0048
```

FIG. 8

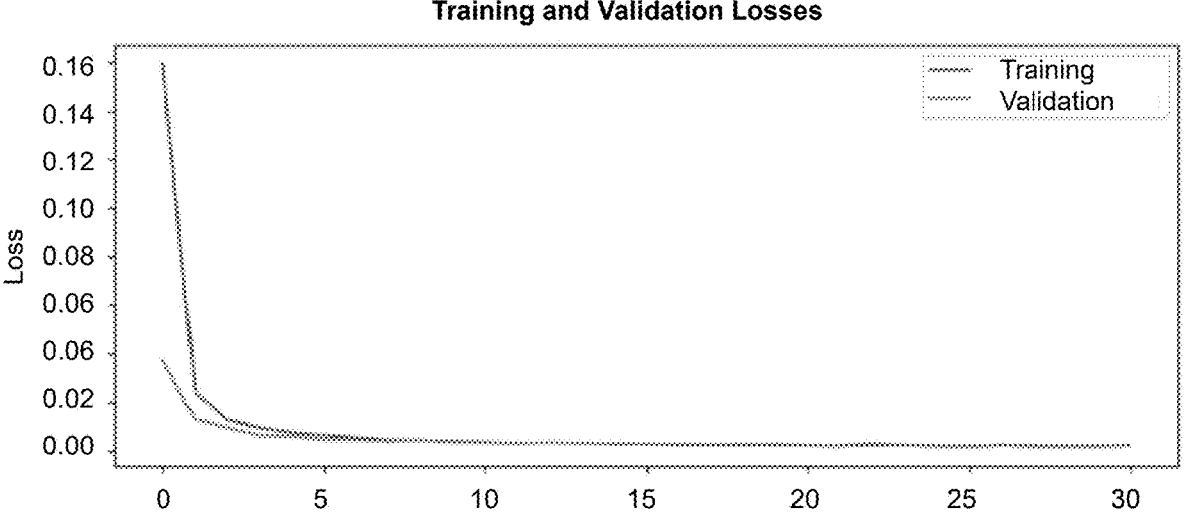
FIG. 9

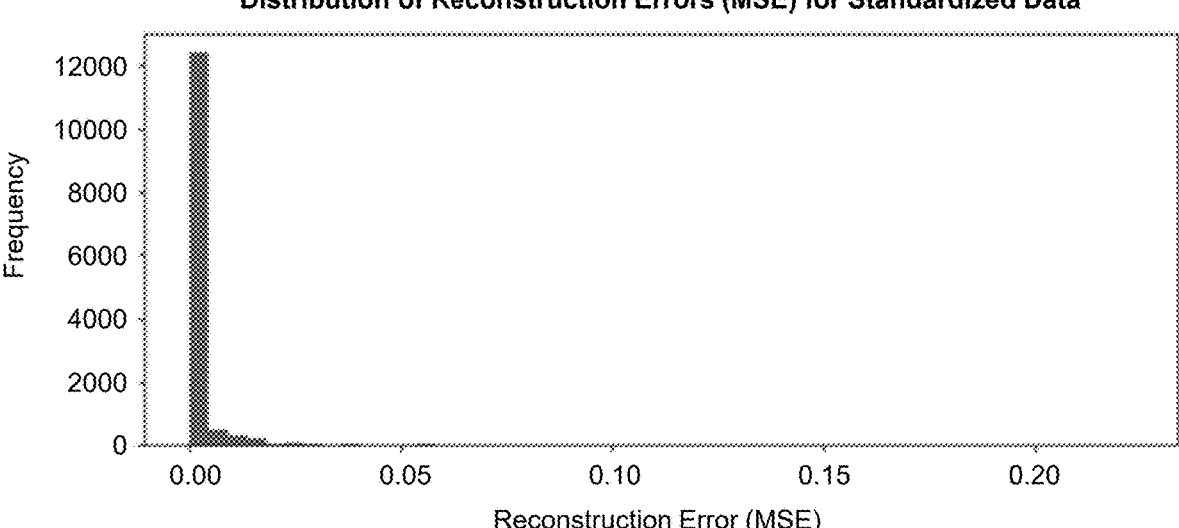
FIG. 10

1100
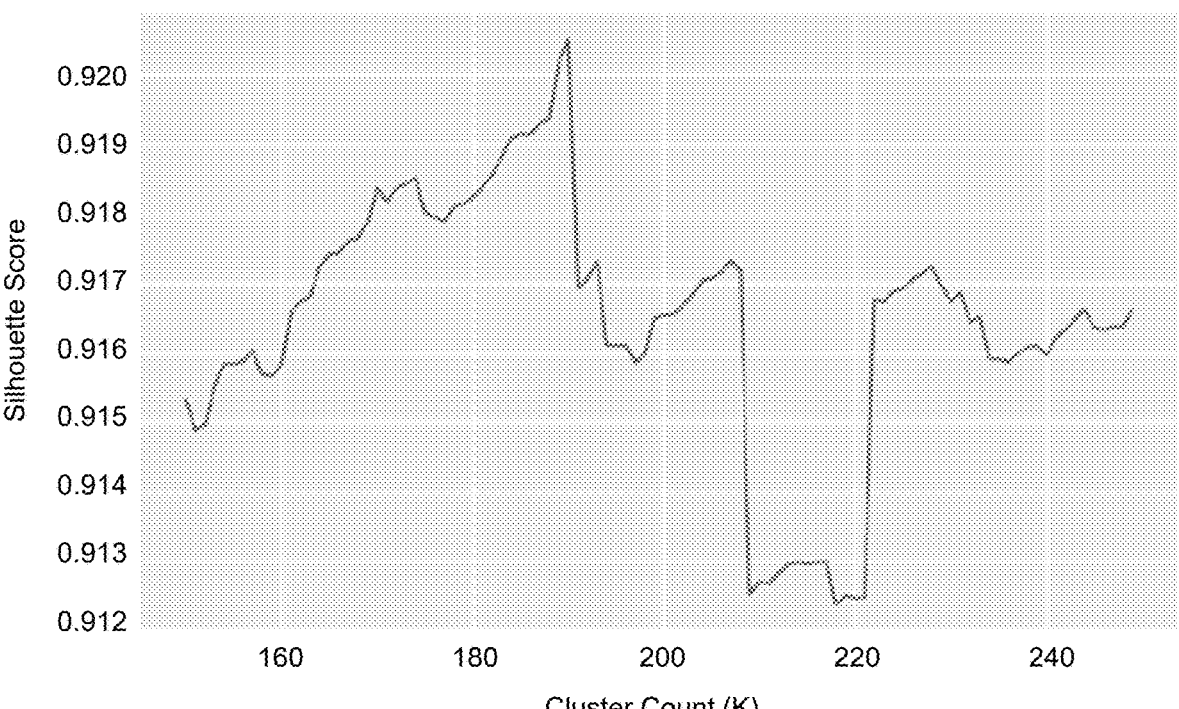
Silhouette Scores
FIG. 11

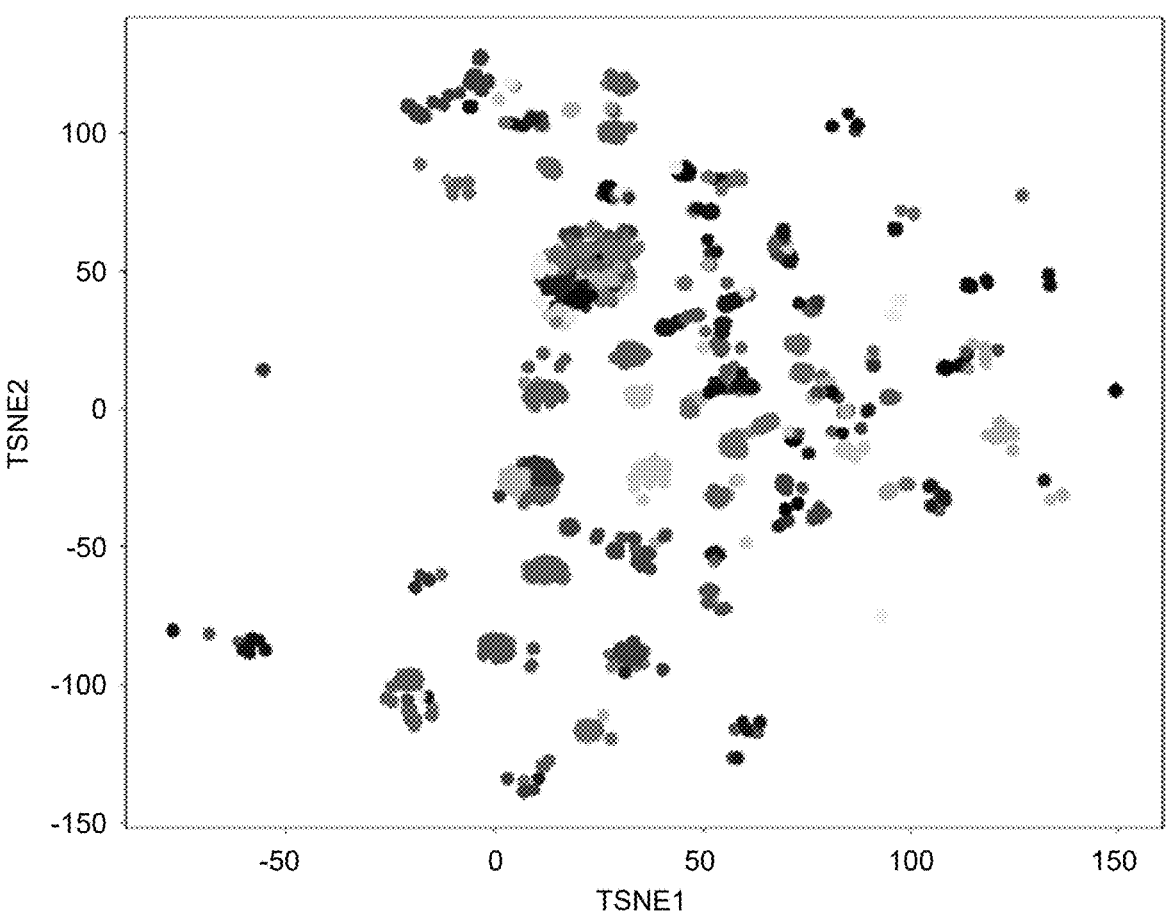
FIG. 12

1300

| Cluster Label | Error Count | Sample Error Log | Cluster Summary |
|---|---|---|---|
| 0 | 7858 | {<br>"ClassName": "System.Exception",<br>"Message": "Rejecting B2B Session as the session Id is already in use.".,<br>"Data": null,<br>"InnerException": {<br>"StatusCode": 409,<br>… | B2B Session Rejection due to Duplicate Session ID (409 Conflict) |
| 8 | 524 | Exception: Process encountered an error. SecurityException: Token retrieval failed. Response status code: 401 (Unauthorized).<br>---><br>HttpRequestException: Response status code: 401 (Unauthorized).<br>at<br>HttpResponseMessage.EnsureSuccessStatusCode()… | Token Retrieval Failure due to Unauthorized Access (401 Error) |
| … | … | … | … |

Application Error Patterns

Error Count

1500

| Customer ID/ Cluster ID | 1 | 2 | 3 | 4 | 5 | ... | Grand Total |
|---|---|---|---|---|---|---|---|
| ID1 | 4.49% | 86.52% | 8.99% | 0.00% | 0.00% | ... | 100.00% |
| ID2 | 93.33% | 0.00% | 3.33% | 3.33% | 0.00% | ... | 100.00% |
| ID3 | 100.00% | 0.00% | 0.00% | 0.00% | 0.00% | ... | 100.00% |
| ID4 | 35.71% | 7.14% | 57.14% | 0.00% | 0.00% | ... | 100.00% |
| ID5 | 90.91% | 0.00% | 0.00% | 0.00% | 9.09% | ... | 100.00% |
| ID6 | 72.73% | 0.00% | 0.00% | 18.18% | 9.09% | ... | 100.00% |
| ID7 | 55.56% | 0.00% | 0.00% | 0.00% | 0.00% | ... | 100.00% |
| ID8 | 87.50% | 0.00% | 12.50% | 0.00% | 0.00% | ... | 100.00% |
| ID9 | 50.00% | 0.00% | 0.00% | 0.00% | 0.00% | ... | 100.00% |
| ... | ... | ... | ... | ... | ... | ... | ... |
| Grand Total | 52.44% | 25.41% | 5.86% | 3.91% | 3.91% | ... | 100.0% |

| Malicious Login Attempts | Count |
|---|---|
| Sep | |
| 9/2/2024 | 5 |
| ')or '1'='1';--- | 3 |
| X9NEcj') OR 4191=LIKE('ABCDEFG',UPPER(HEX(RANDOMBL | 1 |
| admin' or '1'='1';--- | 1 |
| 9/22/2024 | 38 |
| administrator | 7 |
| admin' or '1'='1'# | 3 |
| ')or '1'='1';--- | 3 |
| {{username}} | 3 |
| admin' or '1'='1 | 2 |
| admin@localhost | 2 |
| admin' or '1'='1';--- | 1 |
| '"><script>javascript:alert(document.domain)< | 1 |
| admin' or '1'='1'--- | 1 |
| {{username}}# | 1 |
| admin' AND 4719=4719-- GZHh | 1 |
| admin';cat /etc/passwd | 1 |
| ;'cat /etc/passwd' | 1 |
| ' OR 1=1--- | 1 |
| \'-alert(document.domain),// | 1 |
| something 'wget cro2fo12d088ud6u8q4g8joz859ie9swh. | 1 |
| test"><svg/onload=alert(document.domain)> | 1 |
| <img/src/onerror=alert(document.domain)> | 1 |
| eLJjej') OR 4191=LIKE('ABCDEFG',UPPER(HEX(RANDOMBL | 1 |
| 1@a.com' AND (SELECT 6427 FROM (SELECT(SLEP(7)))L | 1 |
| SQL';INSERT INTO activesessions (SessionID) values | 1 |
| 11 UNION ALL SELECT NULL,CONCAT(1,md5(99999999), 1 | 1 |
| ' Or 1--- | 1 |
| 2mQc6c7C7dlZ4g6Y1WxabHiE2G3 | 1 |
| Grand Total | 43 |

FIG. 16

MACHINE LEARNING-BASED PROCESSING OF LOGS CONTAINING UNSTRUCTURED TEXT DATA

COPYRIGHT NOTICE

BACKGROUND

As the value and use of information continues to increase, individuals and businesses seek additional ways to process and store information. Information processing systems may be used to process, compile, store and communicate various types of information, including through the use of artificial intelligence (AI) and machine learning (ML). Large language models (LLMs) are a type of AI system that uses ML algorithms to process vast amounts of natural language text data. LLMs may be used to perform various natural language processing (NLP) tasks, including text classification, text summarization, text generation, named entity recognition, text sentiment analysis, and question answering.

SUMMARY

Illustrative embodiments of the present disclosure provide techniques for machine learning-based processing of logs containing unstructured text data.

In one embodiment, an apparatus comprises at least one processing device comprising a processor coupled to a memory. The at least one processing device is configured to obtain a plurality of logs associated with operation of one or more information technology assets in an information technology infrastructure environment, the plurality of logs comprising unstructured text data characterizing one or more issues encountered on the one or more information technology assets in the information technology infrastructure environment. The at least one processing device is also configured to generate, utilizing a transformer-based machine learning model, embeddings for the plurality of logs, to select, based at least in part on one or more cluster validation metrics determined by processing the embeddings for the plurality of logs, a target number of clusters, and to determine, utilizing a machine learning-based clustering model that takes as input the target number of clusters, a set of clusters for the plurality of logs. The at least one processing device is further configured to determine a prioritization of the one or more issues encountered on the one or more information technology assets in the information technology infrastructure environment based at least in part on identifying associations between respective ones of the clusters in the determined set of clusters and at least one of (i) applications executing on the one or more information technology assets in the information technology infrastructure environment and (ii) users of the applications executing on the one or more information technology assets in the information technology infrastructure environment. The at least one processing device is further configured to remediate the one or more issues encountered on the one or more information technology assets in the information technology infrastructure environment based at least in part on the determined prioritization.

These and other illustrative embodiments include, without limitation, methods, apparatus, networks, systems and processor-readable storage media.

BRIEF DESCRIPTION OF THE DRAWINGS

FIG. 2 is a flow diagram of an exemplary process for machine learning-based processing of logs containing unstructured text data in an illustrative embodiment.

FIG. 5 shows logs with unstructured text data prior to preprocessing in an illustrative embodiment.

FIG. 6 shows unstructured text data of logs following preprocessing operations in an illustrative embodiment.

FIG. 7 shows pseudocode for generation of an autoencoder model configured for dimensionality reduction in an illustrative embodiment.

FIG. 8 shows an example training flow for an autoencoder model configured for dimensionality reduction in an illustrative embodiment.

FIG. 9 shows a plot of training and validation losses for an autoencoder model configured for dimensionality reduction in an illustrative embodiment.

FIG. 10 shows a plot of reconstruction errors for data processed using an autoencoder model configured for dimensionality reduction in an illustrative embodiment.

FIG. 11 shows a plot of silhouette scores for different numbers of clusters of logs in an illustrative embodiment.

FIG. 12 shows a scatter plot visualization of clusters of logs in an illustrative embodiment.

FIG. 13 shows an example of cluster summaries in an illustrative embodiment.

FIG. 15 shows a heat map of clusters associated with different customer identifiers in an illustrative embodiment.

FIG. 16 shows a table of input texts associated with malicious login attempts in an illustrative embodiment.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Figure 1:
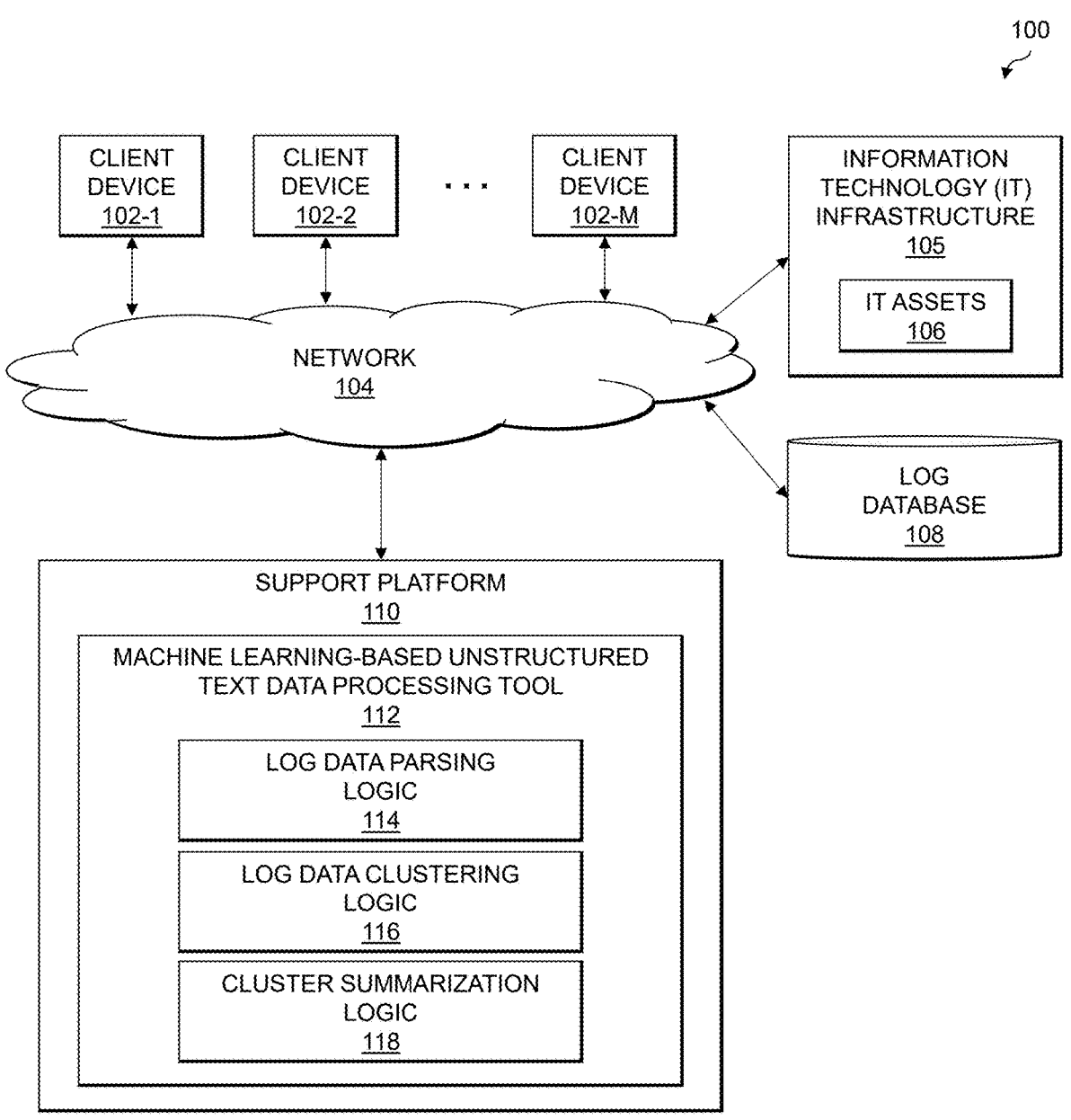
FIG. 1 is a block diagram of an information processing system configured for machine learning-based processing of logs containing unstructured text data in an illustrative embodiment.

FIG. 1 shows an information processing system 100 configured in accordance with an illustrative embodiment. The information processing system 100 is assumed to be built on at least one processing platform and provides functionality for machine learning-based processing of logs containing unstructured text data. The information processing system 100 includes a set of client devices 102-1, 102-2, . . . 102-M (collectively, client devices 102) which are coupled to a network 104. Also coupled to the network 104 is an information technology (IT) infrastructure 105 comprising one or more IT assets 106, a log database 108, and a support platform 110. The IT assets 106 may comprise physical and/or virtual computing resources in the IT infrastructure 105. Physical computing resources may include physical hardware such as servers, storage systems, networking equipment, Internet of Things (IoT) devices, other types of processing and computing devices including desktops, laptops, tablets, smartphones, etc. Virtual computing resources may include virtual machines (VMs), containers, etc.

In some embodiments, the support platform 110 is used for an enterprise system. For example, an enterprise may subscribe to or otherwise utilize the support platform 110 for performing analysis of logs that are produced by or otherwise associated with the operation of the IT assets 106 in the IT infrastructure 105 (e.g., an example of a data center or other IT infrastructure environment). As used herein, the term "enterprise system" is intended to be construed broadly to include any group of systems or other computing devices. For example, the IT assets 106 of the IT infrastructure 105 may provide a portion of one or more enterprise systems. A given enterprise system may also or alternatively include one or more of the client devices 102. In some embodiments, an enterprise system includes one or more data centers, cloud infrastructure comprising one or more clouds, etc. A given enterprise system, such as cloud infrastructure, may host assets that are associated with multiple enterprises (e.g., two or more different businesses, organizations or other entities).

The client devices 102 may comprise, for example, physical computing devices such as IoT devices, mobile telephones, laptop computers, tablet computers, desktop computers or other types of devices utilized by members of an enterprise, in any combination. Such devices are examples of what are more generally referred to herein as "processing devices." Some of these processing devices are also generally referred to herein as "computers." The client devices 102 may also or alternately comprise virtualized computing resources, such as VMs, containers, etc.

The client devices 102 in some embodiments comprise respective computers associated with a particular company, organization or other enterprise. Thus, the client devices 102 may be considered examples of assets of an enterprise system. In addition, at least portions of the information processing system 100 may also be referred to herein as collectively comprising one or more "enterprises." Numerous other operating scenarios involving a wide variety of different types and arrangements of processing nodes are possible, as will be appreciated by those skilled in the art.

The network 104 is assumed to comprise a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks.

The log database 108 is configured to store and record various information that is utilized by the support platform 110. Such information may include, for example, artificial intelligence (AI) and machine learning (ML) models used for performing analysis of logs that are produced by or otherwise associated with operation of the IT assets 106 of the IT infrastructure 105. Such logs may include unstructured text data, and the AI/ML models may be used to cluster the logs and generate natural language text summaries for each of the clusters, with such clusters and cluster summaries also optionally being maintained in the log database 108. The log database 108 may be implemented utilizing one or more storage systems. The term "storage system" as used herein is intended to be broadly construed. A given storage system, as the term is broadly used herein, can comprise, for example, content addressable storage, flash-based storage, network-attached storage (NAS), storage area networks (SANs), direct-attached storage (DAS) and distributed DAS, as well as combinations of these and other storage types, including software-defined storage. Other particular types of storage products that can be used in implementing storage systems in illustrative embodiments include all-flash and hybrid flash storage arrays, software-defined storage products, cloud storage products, object-based storage products, and scale-out NAS clusters. Combinations of multiple ones of these and other storage products can also be used in implementing a given storage system in an illustrative embodiment.

Although not explicitly shown in FIG. 1, one or more input-output devices such as keyboards, displays or other types of input-output devices may be used to support one or more user interfaces to the support platform 110, as well as to support communication between the support platform 110 and other related systems and devices not explicitly shown.

The support platform 110 may be provided as a cloud service that is accessible by one or more of the client devices 102 to allow users thereof to perform issue detection and remediation for different users of an enterprise, organization or other entity. In some embodiments, the client devices 102 are utilized by members of the same enterprise, organization or other entity that operates the support platform 110. In other embodiments, the client devices 102 are utilized by members of one or more enterprises, organizations or other entities different than the enterprise, organization or other entity that operates the support platform 110 (e.g., a first enterprise provides support functionality for multiple different customers, businesses, etc.). Various other examples are possible.

In some embodiments, the client devices 102 and/or the IT assets 106 of the IT infrastructure 105 may implement host agents that are configured for automated transmission of information with the log database 108 and the support platform 110 (e.g., regarding logs that are produced by or otherwise associated with the IT assets 106 of the IT infrastructure 105, log clustering information including cluster summaries, insights garnered from the clusters and cluster summaries, etc.). It should be noted that a "host agent" as this term is generally used herein may comprise an automated entity, such as a software entity running on a processing device. Accordingly, a host agent need not be a human entity.

The support platform 110 in the FIG. 1 embodiment is assumed to be implemented using at least one processing device. Each such processing device generally comprises at least one processor and an associated memory, and implements one or more functional modules or logic for controlling certain features of the support platform 110. In the FIG. 1 embodiment, the support platform 110 implements a machine learning-based unstructured text data processing tool 112. The machine learning-based unstructured text data processing tool 112 comprises log data parsing logic 114, log data clustering logic 116 and cluster summarization logic 118. The log data parsing logic 114 is configured to load raw log data (e.g., from the log database 108, directly from the IT assets 106 of the IT infrastructure 105), and preprocess the raw log data into a format suitable for input to a machine learning-based embedding model that generates embeddings representing the semantic meaning and contextual relationships of the unstructured text of the log data. The machine learning-based embedding model may comprise a Large Language Model (LLM) (e.g., a transformer-based model) that generates the dense vector embeddings. The log data parsing logic 114 is further configured to perform dimensionality reduction, by processing the dense and relatively high-dimensional vector embeddings produced by the machine learning-based embedding model using an autoencoder machine learning model that generated lower-dimensional representations of the vector embeddings. The autoencoder machine learning model may comprise an autoencoder neural network configured to reduce the dimensionality of the vector embeddings produced by the machine learning-based embedding model in a way that seeks to preserve the essential information of the vector embeddings.

The log data clustering logic 116 is configured to analyze the reduced-dimensional data (e.g., the lower-dimensional representations of the vector embeddings) to determine a number of clusters for the log data. This may include determining various clustering validation metrics, including but not limited to silhouette scores. The log data clustering logic 116 is further configured to apply one or more machine learning-based clustering algorithms (e.g., K-means, agglomerative, mean-shift, etc.) to the reduced-dimensional data, to generate a set of clusters (e.g., where the particular number of clusters generated corresponds to the determined number of clusters to be generated for the log data).

The cluster summarization logic 118 is configured to apply one or more machine learning-based text summarization models (e.g., an LLM) to each of the clusters, to generate natural language text summaries for each of the generated clusters. The machine learning-based unstructured text data processing tool 112 is configured to utilize the clusters and cluster summaries in performing troubleshooting and remediation involving the log data (e.g., to determine the most frequent errors or issues for particular users or users generally, to prioritize the remediation of errors or issues based on their determined frequency, to detect configuration issues for particular users based on the number of clusters characterizing different types of errors or issues associated with specific users, etc.).

At least portions of the machine learning-based unstructured text data processing tool 112, the log data parsing logic 114, the log data clustering logic 116 and the cluster summarization logic 118 may be implemented at least in part in the form of software that is stored in memory and executed by a processor.

It is to be appreciated that the particular arrangement of the client devices 102, the IT infrastructure 105, the log database 108 and the support platform 110 illustrated in the FIG. 1 embodiment is presented by way of example only, and alternative arrangements can be used in other embodiments. As discussed above, for example, the support platform 110 (or portions of components thereof, such as one or more of the machine learning-based unstructured text data processing tool 112, the log data parsing logic 114, the log data clustering logic 116 and the cluster summarization logic 118) may in some embodiments be implemented internal to the IT infrastructure 105.

The support platform 110 and other portions of the information processing system 100, as will be described in further detail below, may be part of cloud infrastructure.

The support platform 110 and other components of the information processing system 100 in the FIG. 1 embodiment are assumed to be implemented using at least one processing platform comprising one or more processing devices each having a processor coupled to a memory. Such processing devices can illustratively include particular arrangements of compute, storage and network resources.

The client devices 102, IT infrastructure 105, the IT assets 106, the log database 108 and the support platform 110 or components thereof (e.g., the machine learning-based unstructured text data processing tool 112, the log data parsing logic 114, the log data clustering logic 116 and the cluster summarization logic 118) may be implemented on respective distinct processing platforms, although numerous other arrangements are possible. For example, in some embodiments at least portions of the support platform 110 and one or more of the client devices 102, the IT infrastructure 105, the IT assets 106 and/or the log database 108 are implemented on the same processing platform. A given client device (e.g., 102-1) can therefore be implemented at least in part within at least one processing platform that implements at least a portion of the support platform 110.

The term "processing platform" as used herein is intended to be broadly construed so as to encompass, by way of illustration and without limitation, multiple sets of processing devices and associated storage systems that are configured to communicate over one or more networks. For example, distributed implementations of the information processing system 100 are possible, in which certain components of the system reside in one data center in a first geographic location while other components of the system reside in one or more other data centers in one or more other geographic locations that are potentially remote from the first geographic location. Thus, it is possible in some implementations of the information processing system 100 for the client devices 102, the IT infrastructure 105, IT assets 106, the log database 108 and the support platform 110, or portions or components thereof, to reside in different data centers. Numerous other distributed implementations are possible. The support platform 110 can also be implemented in a distributed manner across multiple data centers.

Additional examples of processing platforms utilized to implement the support platform 110 and other components of the information processing system 100 in illustrative embodiments will be described in more detail below in conjunction with FIGS. 17 and 18.

It is to be understood that the particular set of elements shown in FIG. 1 for machine learning-based processing of logs containing unstructured text data is presented by way of illustrative example only, and in other embodiments additional or alternative elements may be used. Thus, another embodiment may include additional or alternative systems, devices and other network entities, as well as different arrangements of modules and other components.

It is to be appreciated that these and other features of illustrative embodiments are presented by way of example only, and should not be construed as limiting in any way.

An exemplary process for machine learning-based processing of logs containing unstructured text data will now be described in more detail with reference to the flow diagram of FIG. 2. It is to be understood that this particular process is only an example, and that additional or alternative processes for machine learning-based processing of logs containing unstructured text data may be used in other embodiments.

In this embodiment, the process includes steps 200 through 210. These steps are assumed to be performed by the support platform 110 utilizing the machine learning-based unstructured text data processing tool 112, the log data parsing logic 114, the log data clustering logic 116 and the cluster summarization logic 118. The process begins with step 200, obtain a plurality of logs associated with operation of one or more IT assets (e.g., IT assets 106) in an IT infrastructure environment (e.g., IT infrastructure 105). The plurality of logs comprise unstructured text data characterizing one or more issues encountered on the one or more IT assets in the IT infrastructure environment.

In step 202, embeddings for the plurality of logs are generated utilizing a transformer-based machine learning model. The FIG. 2 process may include, prior to generating the embeddings for the plurality of logs, applying data preprocessing to the unstructured text data of the plurality logs. The data preprocessing may comprise at least one of removing noise from the unstructured text data, tokenizing the unstructured text data, and standardizing a data format of the unstructured text data. The transformer-based machine learning model used in step 202 may comprise an LLM that generates, for each log in the plurality of logs, fixed-length vector representations for each of one or more portions of the unstructured text data in that log. Generating the embeddings for the plurality of logs may further include utilizing an autoencoder-based machine learning model to reduce a dimensionality of the embeddings output by the transformer-based machine learning model. The autoencoder-based machine learning model may comprise a multilayer stacked autoencoder comprising an encoder configured to compress input data to a lower-dimensional representation and a decoder configured to reconstruct the input data.

In step 204, a target number of clusters is selected based at least in part on one or more cluster validation metrics determined by processing the embeddings for the plurality of logs. The one or more cluster validation metrics may comprise silhouette scores, and selecting the target number of clusters may comprise selecting a number of clusters with a maximum silhouette score.

A set of clusters for the plurality of logs is determined in step 206 utilizing a machine learning-based clustering model that takes as input the target number of clusters. The machine learning-based clustering model may comprise a K-means clustering model, where K is the selected target number of clusters. The machine learning-based clustering model may also or alternatively comprise at least one of an agglomerative clustering model and a mean-shift clustering model. In some embodiments, the plurality of logs comprise authentication logs, and the determined set of clusters are associated with input texts for different types of potentially malicious login attempts for the IT assets in the IT infrastructure environment. In other embodiments, the plurality of logs comprise user interaction data with an online platform operated by an organization, and the determined set of clusters are associated with different types of fraud in user interactions with the online platform operated by the organization.

A prioritization of the one or more issues encountered on the one or more IT assets in the IT infrastructure environment is determined in step 208. The prioritization is determined based at least in part on identifying associations between respective ones of the clusters in the determined set of clusters and at least one of (i) applications executing on the one or more IT assets in the IT infrastructure environment and (ii) users of the applications executing on the one or more IT assets in the IT environment. Step 208 may include generating a heatmap visualization characterizing the identified associations between respective ones of the clusters in the determined set of clusters and the at least one of (i) the applications executing on the one or more IT assets in the IT infrastructure environment and (ii) the users of the applications executing on the one or more IT assets in the IT environment. The one or more issues encountered on the one or more IT assets in the IT infrastructure environment are remediated in step 210 based at least in part on the determined prioritization.

The FIG. 2 process may further include generating natural language text summaries for each of at least a subset of the determined set of clusters by processing unstructured text data of the subset of the determined set of clusters utilizing an LLM. Remediating the one or more issues encountered on the one or more IT assets in the IT infrastructure environment based at least in part on the determined prioritization in step 210 may comprise utilizing the generated natural language text summaries to identify one or more root causes of at least one of the one or more issues encountered on the one or more IT assets in the IT infrastructure environment.

The particular processing operations and other system functionality described in conjunction with the flow diagram of FIG. 2 are presented by way of illustrative example only, and should not be construed as limiting the scope of the disclosure in any way. Alternative embodiments can use other types of processing operations. For example, as indicated above, the ordering of the process steps may be varied in other embodiments, or certain steps may be performed at least in part concurrently with one another rather than serially. Also, one or more of the process steps may be repeated periodically, multiple instances of the process can be performed in parallel with one another, etc.

Functionality such as that described in conjunction with the flow diagram of FIG. 2 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

The technical solutions described herein address technical challenges associated with managing and analyzing large volumes of unstructured text data, such as application logs and machine logs, which are typically complex, time-intensive and resource-demanding to process using conventional approaches. These limitations of conventional approaches hinder timely anomaly detection, pattern recognition, and insight generation, often resulting in delayed responses to critical issues and missed opportunities for optimization.

To overcome these and other technical challenges of conventional approaches, illustrative embodiments provide technical solutions for the efficient management and analysis of large volumes of unstructured text data (e.g., application logs and/or machine logs produced by or otherwise associated with operation of IT assets in an IT infrastructure environment) using unsupervised machine learning techniques. Through automating the traditionally complex and time-intensive unstructured text analysis processes, the technical solutions described herein significantly enhance efficiency. The technical solutions described herein leverage unsupervised machine learning to identify clusters within datasets, grouping objects with similar characteristics while distinguishing them from others. This approach facilitates proactive anomaly detection, pattern recognition and actionable insight generation. The technical solutions described herein may be used for various application scenarios, including but not limited to identifying error trends in logs (e.g., application logs and/or machine logs produced by or otherwise associated with operation of IT assets in an IT infrastructure environment), analyzing purchase order rejections, detecting anomalies, etc. By transitioning from reactive troubleshooting to proactive analysis, the technical solutions described herein minimize issue escalation and improve decision-making across diverse use cases.

The rapid growth of unstructured text data, such as application and machine logs, poses significant challenges for efficient analysis and insight extraction. Conventional approaches, which rely on manual processes or rule-based systems are often slow, error-prone and resource-intensive, making it difficult to identify patterns, detect anomalies and/or respond proactively to emerging issues. This results in reactive troubleshooting, delayed decision-making and missed opportunities for optimization, particularly in scenarios where timely insights are critical, such as error trend analysis or anomaly detection. To address these and other technical challenges, illustrative embodiments provide technical solutions that leverage unsupervised machine learning to automate the analysis of large-scale unstructured text data. By clustering data into groups of similar objects, the technical solutions described herein enable efficient pattern recognition, proactive anomaly detection and actionable insight generation, significantly enhancing operational efficiency and decision-making across diverse applications. This approach shifts the paradigm from reactive responses to proactive analysis, mitigating risks, reducing costs and unlocking the full potential of unstructured text data.

The technical solutions described herein address the significant technical challenges and inefficiencies faced when analyzing large volumes of unstructured text data, such as application logs, machine logs and similar datasets. Conventional approaches for text data analysis rely heavily on manual processes or predefined rules, both of which are time-consuming, error-prone and require substantial human expertise. Such conventional approaches often struggle to keep pace with the increasing volume and complexity of modern data, leading to delayed insights and reactive responses to issues. For instance, in application logs, critical error patterns or anomalies may remain undetected until they escalate into larger problems, negatively impacting system performance, customer experience and/or business outcomes.

Additionally, unstructured text data inherently lacks a fixed schema, making it challenging to identify meaningful patterns or trends without significant preprocessing or domain-specific knowledge. This complexity often prevents organizations from fully leveraging their data to gain actionable insights. Furthermore, conventional reactive troubleshooting approaches are not equipped to proactively identify and mitigate emerging issues, resulting in inefficiencies, increased operational costs and missed opportunities for optimization.

The technical solutions described herein address these and other technical challenges by introducing a system that automates the analysis of unstructured text data using unsupervised machine learning techniques. The technical solutions described herein overcome the limitations and technical challenges of conventional approaches by clustering data into meaningful groups based on inherent similarities, enabling efficient detection of anomalies, identification of recurring patterns and extraction of actionable insights. This proactive approach shifts the focus from reactive troubleshooting to preventative analysis, significantly enhancing decision-making capabilities and operational efficiency across diverse applications such as error trend analysis in logs, purchase order rejection diagnostics and anomaly detection in system outputs.

The technical solutions described herein provide a transformative approach to managing and analyzing large-scale unstructured text data, such as application and machine logs produced by or otherwise associated with operation of IT assets in an IT infrastructure environment, by leveraging advanced unsupervised machine learning techniques and large language models (LLMs). Conventional approaches for analyzing such data are labor-intensive, time-consuming and prone to errors, limiting their ability to deliver actionable insights quickly. The technical solutions described herein address these and other technical challenges by automating the analysis process, enabling proactive identification of anomalies, recognition of patterns and generation of insights. The technical solutions described herein are thus able to enhance operational efficiency, reduce costs, and support data-driven decision-making across a variety of applications.

Figure 3:
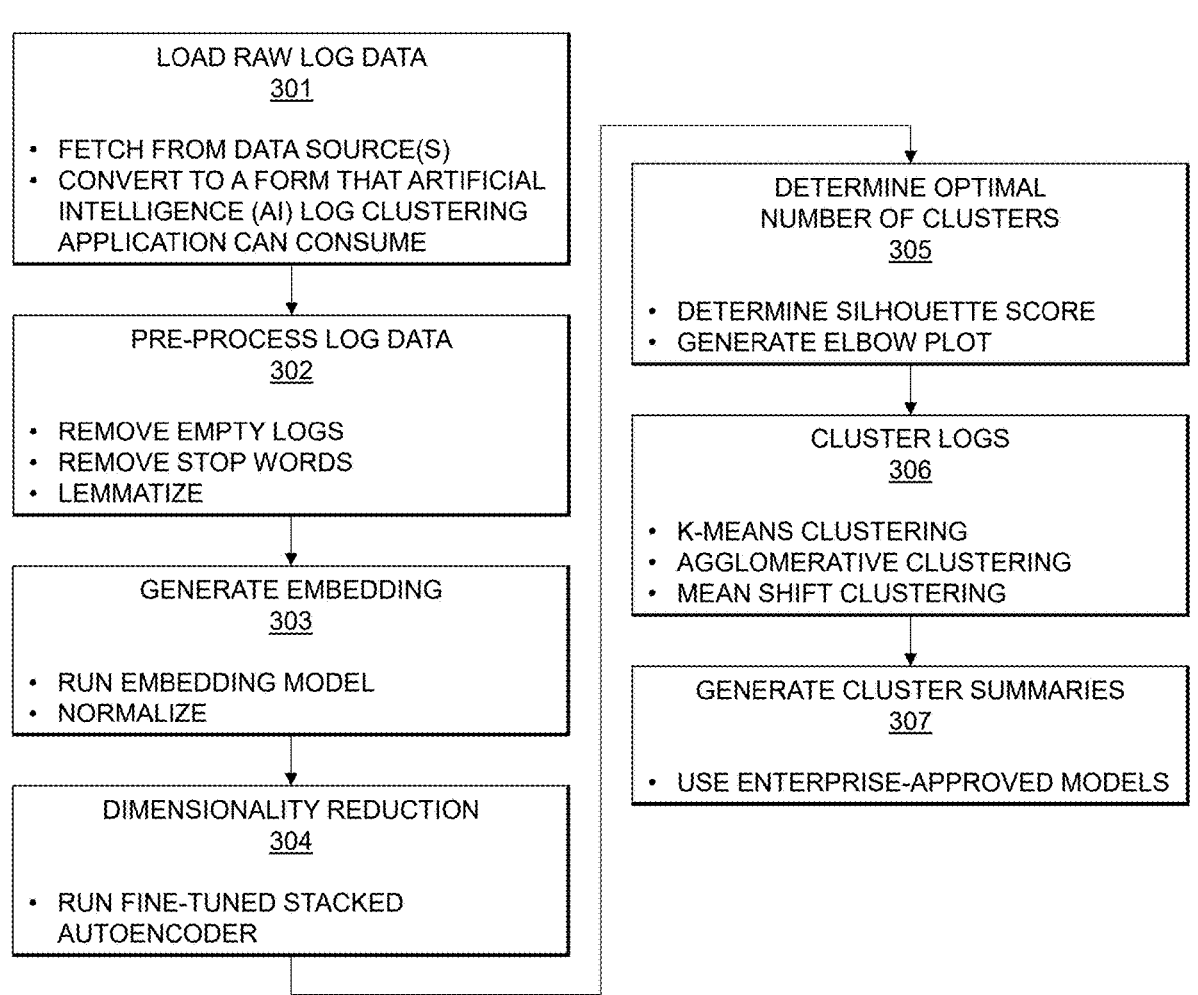
FIG. 3 shows a system workflow for processing of unstructured text data to generate clusters and cluster summaries in an illustrative embodiment.

FIG. 3 shows a system flow 300 for an integrated pipeline that processes unstructured text data. The system flow 300 includes loading raw log data in block 301, preprocessing data in block 302, generating embeddings in block 303, dimensionality reduction in block 304, determining an optimal number of clusters in block 305, clustering the logs in block 306 and generating cluster summaries in block 307.

Loading raw log data in block 301 includes ingesting unstructured text data, such as application logs, machine logs or other similar datasets. These logs, which typically lack a structured schema, are loaded into a processing environment where further analysis can occur. Block 301 includes fetching the raw log data from data sources, and converting the raw log data to a form that AI/ML clustering applications can consume.

Preprocessing of the log data in block 302 includes applying preprocessing to clean, normalize and transform the raw logs into a suitable format for analysis. The preprocessing includes, for example, removing irrelevant data or noise, tokenizing text into smaller components for easier processing and standardizing the data format to enable consistent downstream operations. Block 302 may include removing empty logs, removing stop words, lemmatizing, etc.

Generating embeddings in block 303 may utilize an embedding model (e.g., an LLM or other transformer-based model, such as a sentence-transformers model like all-MiniLM-L6-v2) to transform the cleaned and preprocessed data into embeddings. The embeddings are dense vector representations of the text, capturing semantic meaning and contextual relationships. This transformation allows the system to understand complex patterns and relationships inherent in the data. Block 303 may include running an embedding model and normalizing the data.

Dimensionality reduction in block 304 may utilize an autoencoder to efficiently process the high-dimensional embeddings. An autoencoder is a type of neural network designed for dimensionality reduction. The autoencoder compresses the embeddings into lower-dimensional representations while preserving critical information, improving computational efficiency. Block 304 may include running a fine-tuned stacked autoencoder.

Determining the optimal number of clusters in block 305 includes using the reduced-dimensional data to identify the ideal or optimal number of clusters by applying silhouette scoring. This technique evaluates the compactness and separation of potential clusters, ensuring that the chosen number maximizes meaningful grouping. Block 305 may include determining silhouette scores and generating an elbow plot.

Clustering the logs in block 306 includes utilizing a clustering algorithm (e.g., a K-means clustering algorithm, an agglomerative clustering algorithm, a mean shift clustering algorithm, combinations thereof, etc.) which organizes the logs into distinct groups based on inherent similarities in their embeddings. Each cluster represents a set of logs with similar characteristics, facilitating the identification of patterns, trends, anomalies, etc.

Generating cluster summaries in block 307 includes, for each identified cluster, generating a summary of that cluster using an LLM. These summaries provide human-readable insights into the characteristics and common themes of each cluster, making it easier for stakeholders to interpret and act on the results. Block 307 may utilize enterprise-approved models (e.g., for an enterprise operating the IT infrastructure environment comprising the IT assets which produced the logs being analyzed).

The technical solutions described herein provide various key innovations and technical advantages, including the automation of complex analysis, proactive anomaly detection, scalability, improved decision-making and being domain agnostic. The automation of complex analysis includes automating traditionally manual processes, such as identifying error patterns and clustering logs, significantly reducing time and resource requirements. Proactive anomaly detection is provided by leveraging clustering and unsupervised learning to enable proactive identification of anomalies and emerging trends, mitigating risks before they escalate into critical issues. Scalability is provided in that the processing pipeline is designed to handle large-scale unstructured datasets, making it suitable for applications in industries such as IT operations, manufacturing and e-commerce. Improved decision-making is provided through the integration of advanced machine learning models which allow for the extraction of actionable insights, facilitating data-driven decisions across diverse use cases. The system is advantageously domain agnostic, and flexible such that it can be applied to various domains, including error trend analysis in application logs, diagnosing purchase order rejections and detecting anomalies in operational systems. Example applications include: error trend analysis in application logs, where the system identifies recurring error patterns enabling support teams to address root causes and improve software reliability; analyzing purchase order rejections, where by clustering rejection logs, the system uncovers reasons for order failures, helping businesses refine their processes and improve customer satisfaction; detecting anomalies in system outputs, where the system flags unusual patterns in machine logs, ensuring proactive maintenance and reduced downtime in industrial operations; etc.

An example workflow for implementing a system for analyzing unstructured text data (e.g., application logs) using the system flow 300 will now be described. This workflow outlines the integration of key steps and technologies. The workflow begins with ingesting raw log data in block 301, with the input being unstructured text data (e.g., application logs, machine logs, etc.), where the raw data loaded into the system (e.g., from various sources, such as log files stored in cloud storage or databases, logs which are directly streamed from log collection systems, etc.) is processed to produce an output of logs in a processing environment.

The data is then preprocessed in block 302, with the input being raw log data that is processed for noise removal (e.g., eliminating irrelevant information such as timestamps or repeated redundant data), text tokenization (e.g., breaking down text into meaningful units) and data normalization (e.g., standardizing formats such as dates or units), with the output being cleaned and normalized logs.

Embeddings are then generated in block 303, with the input being the preprocessed logs which are processed using an LLM (e.g., OpenAI GPT or another similar transformer-based model) to generate dense vector embeddings that represent the semantic meaning and contextual relationships of the text, with the output being high-dimensional embeddings representing the logs.

Dimensionality reduction is performed in block 304, with the input being the high-dimensional embeddings which are processed using an autoencoder neural network that reduces the dimensionality of the embeddings while preserving essential information (e.g., where the reduced data enables more efficient processing and visualization), with the output being lower-dimensional representations of the embeddings.

An optimal number of clusters is determined in block 305, with the input being the reduced-dimensional data that is processed using silhouette scoring or other suitable clustering validation metrics to determine the optimal number of clusters ensuring meaningful segmentation of the data, with the output being the optimal cluster count.

Clustering is performed in block 306, with the input being the reduced-dimensional embeddings and the optimal cluster count, which is processed using a clustering algorithm (e.g., K-means, agglomerative, mean-shift, etc.) that organizes the data into distinct clusters based on similarity, with the output being clustered logs where each cluster represents logs with similar characteristics.

Cluster summaries are generated in block 307, with the input being the clustered logs which are processed using an LLM to create concise summaries of each cluster (e.g., where the summaries describe patterns, themes or anomalies within each cluster), with the output being human-readable natural language summaries of each cluster.

Figure 4:
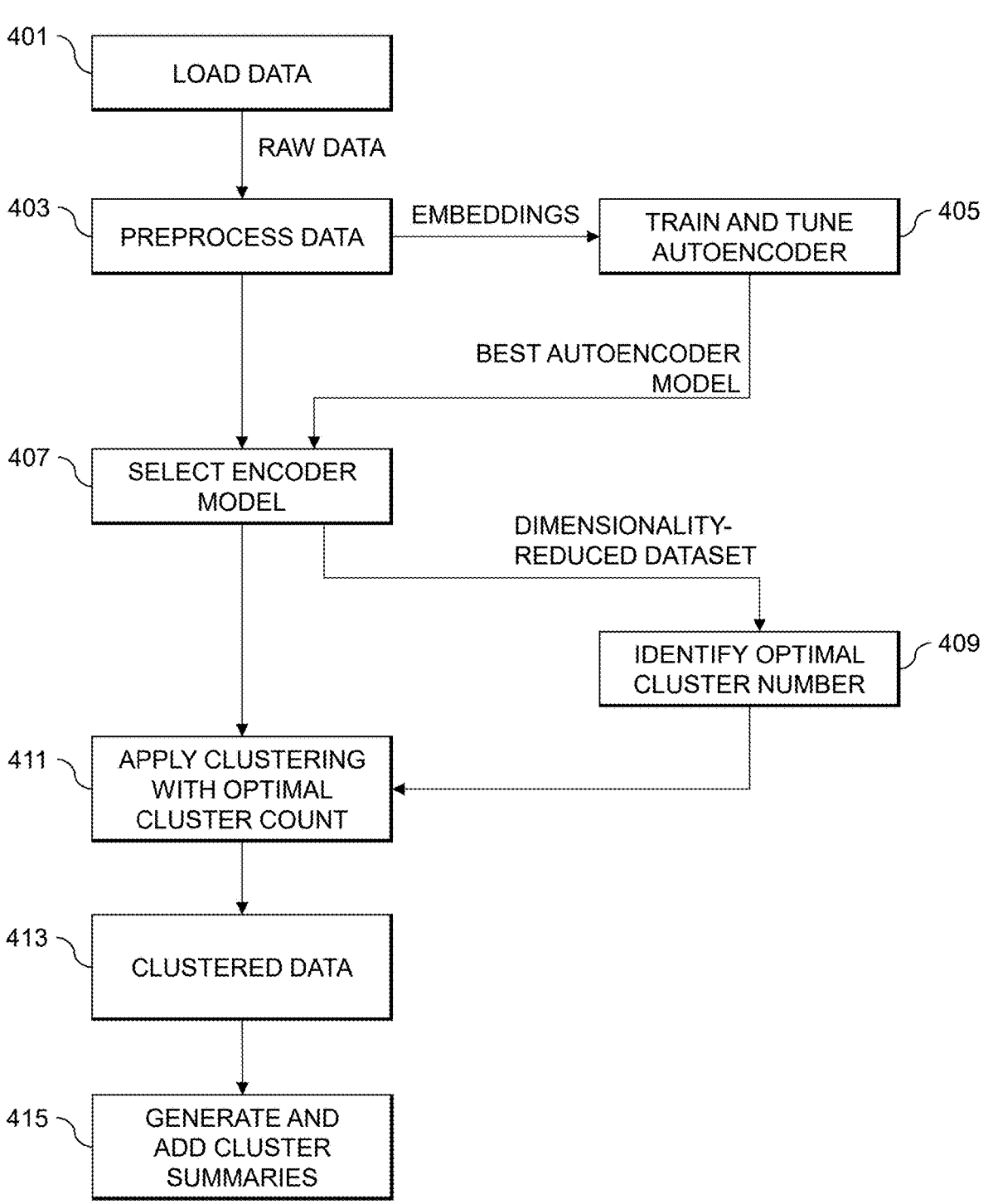
FIG. 4 shows a process flow for processing of unstructured text data to generate clusters and cluster summaries in an illustrative embodiment.

FIG. 4 shows a process flow 400 for generating clusters and cluster summaries. The process flow 400 begins with loading data in step 401, followed by preprocessing the raw data in step 403. The preprocessed data is used to generate embeddings, which are used for training and tuning autoencoder models in step 405. The best performing autoencoder model is determined in step 407 and used to produce a dimensionality-reduced dataset. In step 409, the best or optimal cluster number is identified. In step 411, clustering is applied (using the optimal cluster count identified in step 409) to produce clustered data 413. The clustered data 413 is then processed (e.g., using an LLM) to generate and add cluster summaries in step 415.

An example implementation of the system flow 300 will now be described. Loading data in block 301 includes loading data from one or more data sources (e.g., files, databases, etc.) and saving the data in a suitable format (e.g., a byte stream, such as the Python pickle format in a .pkl file) for further processing. The steps involved include loading data from the data sources into data frames, attaching mapping data as additional columns (e.g., timestamp, user identifier (ID), source ID, application, etc.), and persisting the data as .pkl files for preprocessing.

Figure 6:
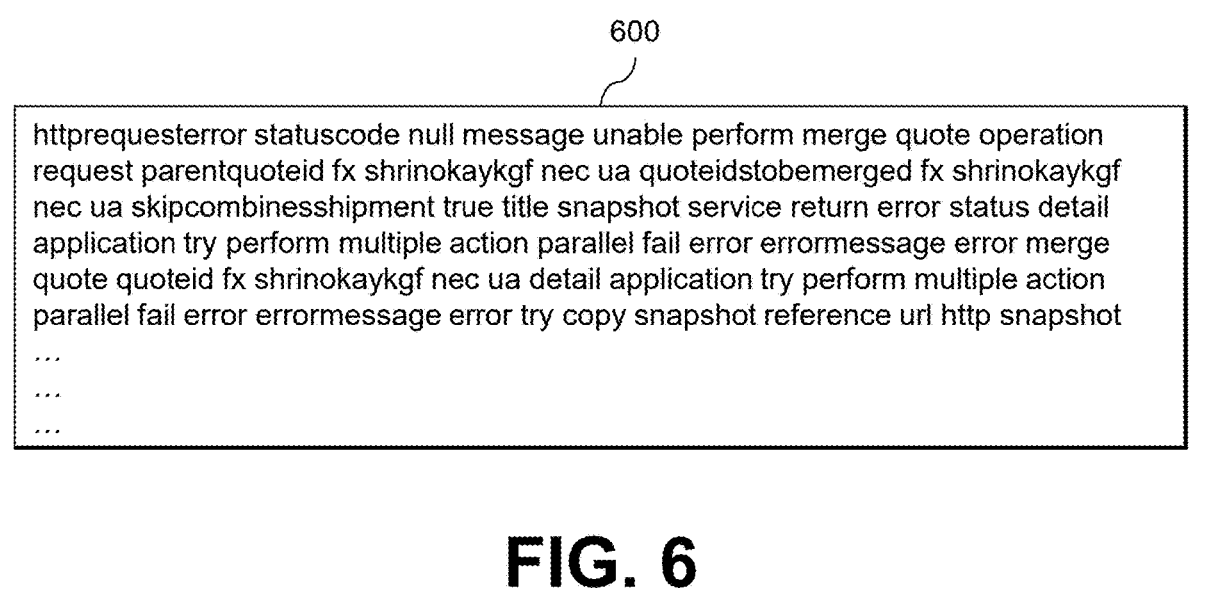

Preprocessing the data in block 302 includes various operations, such as removing any zero-length text, converting the text to lowercase, tokenizing the text into individual words, removing stop words, lemmatizing the words to reduce dataset complexity, generating embeddings for each word and aggregating them, and normalizing the aggregated embeddings using a standard scaler. Prior to applying preprocessing in block 302, a word cloud generated from the log data (e.g., where the size of each word reflects its frequency) would have special characters and stop words being the most prominent elements. Following the preprocessing in block 302, the word cloud no longer prominently features special characters or stop words, allowing more meaningful terms such as "buyer", "service", "punchout", "null" and "api" to stand out. FIG. 5 shows an example of unstructured text data 500 before the preprocessing in block 302, and FIG. 6 shows an example of unstructured text data 600 following the preprocessing in block 302.

Embeddings are generated in block 303, and a multilayer stacked autoencoder is trained and tuned to learn a lower-dimensional representation of the data. This representation captures the most important features and also removes noise by focusing on the underlying signal. FIG. 7 shows pseudo-code 700 for training and tuning the multilayer stacked autoencoder. The pseudocode 700 illustrates the autoencoder designed for dimensionality reduction, which comprises an encoder and a decoder. The encoder compresses input data through an input layer, a dense layer with "tanh" activation, a batch normalization layer, a dropout layer for regularization, and another dense layer that reduces the dimensions to half of the initial hidden layer. The decoder reconstructs the original input using a symmetric architecture, including a dense layer mirroring the encoder's second layer, a batch normalization layer, a dropout layer and a final dense layer with "linear" activation. This structure efficiently learns to compress and reconstruct data, facilitating effective dimensionality reduction. In addition to reducing dimensionality, autoencoders can also extract non-linear patterns that are inherent in natural language text. This advantageously further aids clustering algorithms in effectively separating data patterns. Note that the most compressed representation in the latent space will have dimensions equal to half the size of the "encoding_dim" parameter. For example, if encoding_dim is 150, the most compressed latent layer will have 75 dimensions.

FIG. 8 shows a snapshot 800 of a portion of a fine-tuning process for the autoencoder. As seen in trial 5 of the snapshot 800, the encoding_dim is set to 122, achieving a compressed dimensionality of 61. This represents a 39% reduction from the input dimensionality of 100. Despite this compression, the model has significantly reduced the training and validation losses, indicating that it can effectively reconstruct the original data from the compressed dimensions. FIG. 9 shows a plot 900 illustrating training and validation losses for the best model following fine-tuning. At the start, the training loss is relatively high (e.g., above 0.0200) but drops sharply within the first few epochs. This fine-tuned model is used in the subsequent step to reduce the dimensionality of embeddings created for log entries. Note that these embeddings were generated with a dimension of 100, and the autoencoder in this example is designed to reduce this dimensionality to between 75 and 50 dimensions.

Dimensionality reduction is performed in block 304. At this point, the tuned autoencoder model has learned to efficiently reconstruct the dataset using less than 75% of the original dimensions of the embedding vectors. FIG. 10 shows a plot 1000 of the distribution of reconstruction errors (e.g., Mean Squared Error, MSE) for the standardized data. In the plot 1000, the x-axis represents the reconstruction error values while the y-axis represents the frequency of occurrences of those errors. This histogram in plot 1000 illustrates that the majority of the data points have very low reconstruction errors, indicating that the autoencoder is performing well in terms of reconstructing the data accurately. A small number of data points show higher reconstruction errors, but these are significantly less frequent. This low distribution of errors indicates that the autoencoder is not only efficient in terms of dimensionality reduction, but is also effective in maintaining the integrity of the original data during the reconstruction process. By focusing on the most important features, the autoencoder can minimize noise and produce a clean lower-dimensional representation. This capability is reflected in the concentrated low-error distribution shown in the histogram.

An optimal number of clusters is determined in block 305. Identifying the ideal or optimal cluster count may include plotting the silhouette score for different numbers of clusters, and then picking the cluster count with the maximum silhouette score. FIG. 11 shows a plot 1100 displaying silhouette scores across different cluster counts (K) using K-means clustering. In this example, the maximum silhouette score achieved is 0.9205105304718018, which occurs at a cluster count of 190. The cluster count with the highest silhouette score is selected as the cluster count argument passed to the clustering model.

Logs are clustered in block 306, using K-means or another suitable clustering algorithm and the ideal cluster count determined in block 305. FIG. 12 shows a scatter plot 1200 visualizing clusters from an arbitrary execution using the t-SNE (t-distributed Stochastic Neighbor Embedding) technique. The higher dimensional data used for clustering is projected into two dimensions (denoted TSNE1 and TSNE2) for visualization. For cluster formation, points are grouped into distinct clusters based on their t-SNE coordinates. Some clusters are tightly packed, indicating a high degree of similarity within the cluster. Other clusters are more spread out, reflecting more variability among their points. Color coding uses different colors (e.g., different shades of gray in the scatter plot 1200) to differentiate the clusters. The scatter plot 1200 showcases a variety of colors (shades of gray) each representing separate clusters. There is considerable variation in cluster density. Some areas of the scatter plot 1200 show densely packed points, indicating regions with high similarity. Other areas have sparsely distributed points, indicating greater dissimilarity or less tight grouping. Sparsely distributed points in a t-SNE plot can indicate several things, including potential anomalies or outliers. Careful interpretation, however, is necessary. Potential interpretations include identifying anomalies or outliers, natural data variation, cluster boundaries, and projection artifacts. Points may be anomalies or outliers if they deviate from dense clusters. A sparse distribution might reflect natural variability in the dataset (e.g., natural data variation). Sparse points can also denote boundary regions of clusters with naturally lower density (e.g., cluster boundaries). t-SNE might create sparsity artifacts (e.g., projection artifacts)

when projecting high-dimensional data into two dimensions. Steps to confirm include performing cluster analysis (e.g., examining data points in their original high-dimensional feature space), applying statistical methods (e.g., using anomaly detection algorithms to confirm if data points are outliers), and leveraging domain knowledge (e.g., applying domain-specific knowledge to assess the sparsity).

Figure 14:
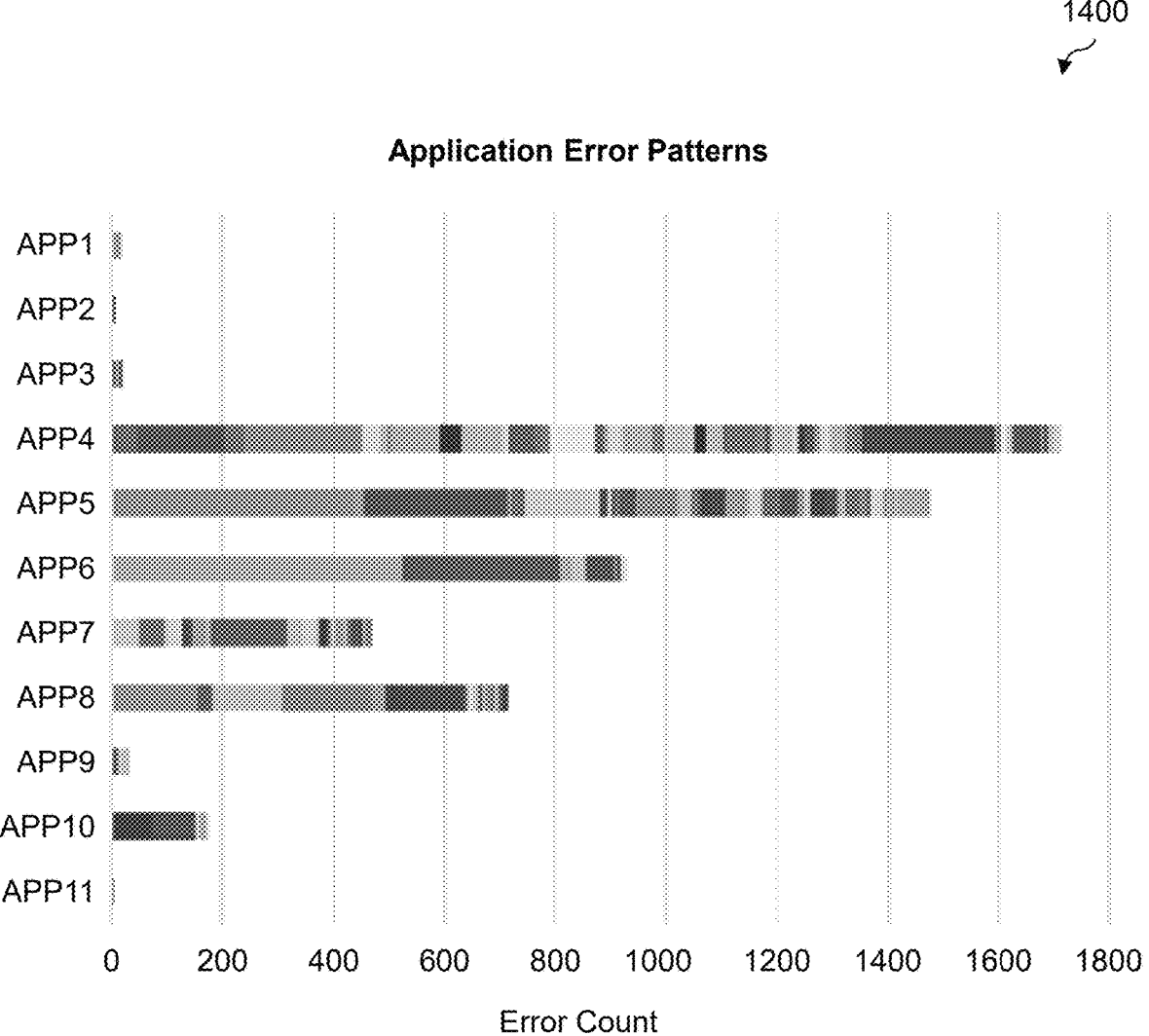
FIG. 14 shows a stacked bar chart of application error patterns in an illustrative embodiment.

Cluster summaries are generated in block 307. FIG. 13 shows a table 1300 of cluster summaries, showing cluster labels, error counts, sample error logs and cluster summaries for different clusters. FIG. 14 shows a stacked bar chart plot 1400, generated using the log clusters for visualizing error patterns across various applications, offering a clear comparative overview of the error distribution. The y-axis in stacked bar chart plot 1400 lists the applications, and the x-axis in stacked bar chart plot 1400 shows the error count. The total bar length represents the total error count for each application, with the colored segments (e.g., in different shades of gray) differentiating distinct error patterns within each application. Each bar's length on the x-axis indicates the total number of errors logged by the corresponding application on the y-axis. The differently colored or shaded segments within each bar represent various error patterns, giving a detailed view of the types of errors contributing to the total count.

FIG. 15 shows a table 1500, showing sample data for analyzing purchase order rejections, with different customer IDs and cluster IDs. The table 1500 provides a heatmap generated after clustering customer rejections on purchase orders for a defined period of time. The heatmap represents the distribution of rejections of various customers across different clusters following the application of the specified clustering technique. The columns in the table 1500 are labeled with cluster IDs, while the rows are labeled with customer IDs. Each cell contains a percentage value, indicating the proportion of rejections associated with a particular customer ID in a given cluster. This allows for prioritizing remediation actions (e.g., to focus on the clusters of issues that affect greater number of customers, to provide support for a particular customer by analyzing the clusters of issues that most affect that customer, etc.). As observed, the purchase order rejections under cluster 1 seem to impact the majority of customers, and thus addressing these issues could significantly improve overall customer experience. Another observation is the certain customers face purchase order rejections distributed across multiple clusters, suggesting potential configuration or integration issues. A further observation is that some customers face purchase order rejections that are unique to them, potentially indicating issues exclusive to those sets. The heatmap shown in the table 1500 of FIG. 15, generated using the clusters, provides an intuitive visual assessment of where most purchase order rejections for each customer ID are concentrated, with higher percentages marked in darker shades (or, in a color plot, shades closer to red than green). However, careful interpretation of the actual log entries is necessary to identify the real causes of these issues.

Another use case for the technical solutions described herein is in detecting malicious login attempts, where authentication logs are clustered to identify patterns of potentially malicious login attempts, such as brute-force attacks or credential stuffing. This allows for improved cybersecurity by enabling real-time detection and prevention of unauthorized access. FIG. 16 shows a table 1600 of malicious login attempts across different dates, and the counts of malicious login attempts associated with different malicious texts. The table 1600 summarizes the malicious login attempts detected in system logs for September 2024 using an implementation of the technical solutions described herein. These attempts primarily involve SQL injection, cross-site scripting (XSS) and other common web application exploits. The first column in table 1600 lists the various malicious texts enters in the user ID field. The anomalies are categorized by date and pattern, with detailed analysis and recommendations provided below.

In this example, most detected attempts involved SQL injection, evidenced by payloads like "admin' or '1'='1'". To mitigate these threats, parameterized queries may be implemented, along with using prepared statements. Several XSS attempts were detected, which may be prevented by properly encoding output using Content Security Policy (CSP) headers and validating user inputs. Command injection and path traversal includes attempts to access sensitive files like /etc/passwd, which indicate command injection vulnerabilities. These may be prevented by validating input and avoiding unsafe system command functions. Monitoring and alert mechanisms may be enhanced for suspicious login patterns to quickly detect and respond to malicious activities. Regular security audits and penetration testing may be performed to identify and mitigate potential vulnerabilities. Using the clustering algorithm in a security framework improves the ability to detect, categorize and response to malicious login attempts, enhancing the efficiency and robustness of threat detection processes.

Another use case for the technical solutions described herein is in error trend analysis for IT operations, which includes automating the identification of recurring error patterns in application and system logs. Error trend analysis enables reducing downtime and accelerating root cause analysis for critical system failures. An example workflow includes ingesting logs from a web application into the system, preprocessing to remove and normalize error codes, generating LLM embeddings that capture the semantic context of log entries, performing dimensionality reduction to reduce computational complexity, clustering groups of similar logs into categories (e.g., authentication errors, database timeout issues, and network failures), and generating cluster summaries. The cluster summaries reveal actionable insights (e.g., "Cluster 1: high occurrence of '403 Forbidden' errors due to incorrect permissions", "Cluster 2: 'DB Connection Timeout' errors correlate with high traffic during peak hours", etc.). These insights enable proactive fixes, such as optimizing permission settings or scaling database resources.

Another use case for the technical solutions described herein is in anomaly detection for industrial systems, which includes detecting unusual patterns in machine logs to identify potential failures before they occur. This enables predictive maintenance, reducing costly downtimes in manufacturing or logistics. Yet another use case for the technical solutions described herein is in customer behavior analysis for e-commerce, which includes clustering unstructured customer interaction data to uncover buying patterns or issues. This enables enhanced personalization and improved fraud detection in online platforms. Still another use case for the technical solutions described herein is in proactive application performance monitoring, which includes identifying performance bottlenecks in real-time by clustering and summarizing system anomalies. This enables improved system reliability and user experience by addressing potential issues before they escalate.

The technical solutions described herein provide various technical advantages, including: automated processing of unstructured text data through combining unsupervised learning and LLMs to automate the conventional manual and time-intensive process of analyzing unstructured text data thereby significantly enhancing efficiency and reducing reliance on human expertise; context-aware embedding and clustering through uniquely leveraging LLMs to generate rich, semantic embeddings of unstructured text data that enable precise clustering and pattern recognition without the need for domain-specific preprocessing or customization; cluster summarization for interpretability through innovative application of LLMs to produce human-readable summaries of each cluster, translating complex log patterns into actionable insights bridging the gap between technical outputs and business decision-making; proactive anomaly detection; generation of human-readable summaries using LLMs, which provides intuitive cluster-specific summaries using LLMs making complex data insights accessible to non-technical stakeholders; providing a scalable architecture that is designed to handle large volumes of unstructured text data, making it applicable to industries with extensive logging requirements such as IT operations, manufacturing and e-commerce; providing a domain-agnostic application that is adaptable to various use cases, including error trend analysis, purchase order rejection diagnostics and anomaly detection, without requiring domain-specific preprocessing or customization; and innovative combinations of state-of-the-art techniques including LLMs, autoencoders and K-means clustering in a novel pipeline for unstructured data analysis, bridging gaps and addressing technical challenges of conventional approaches.

The technical solutions described herein provide various benefits, including: increased efficiency through the automated analysis of unstructured text data, reducing time, resources and dependency on manual processes; proactive problem solving enabling early detection and resolution of issues, reducing downtime and improving system reliability; cost savings by minimizing operational costs through optimizing workflows and reducing labor-intensive tasks; enhanced decision-making through providing actionable insights for real-time, data-driven decisions across various business units; scalability and versatility through application across different domains like IT operations, supply chain and e-commerce, enhancing productivity across an enterprise, organization or other entity; improved customer or other user experience through ensuring system reliability and faster issue resolution, directly boosting customer or other user satisfaction; and strategic alignment through supporting focus on innovation, AI/ML adoption and operational excellence.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for machine learning-based processing of logs containing unstructured text data will now be described in greater detail with reference to FIGS. 17 and 18. Although described in the context of system 100, these platforms may also be used to implement at least portions of other information processing systems in other embodiments.

Figure 17:
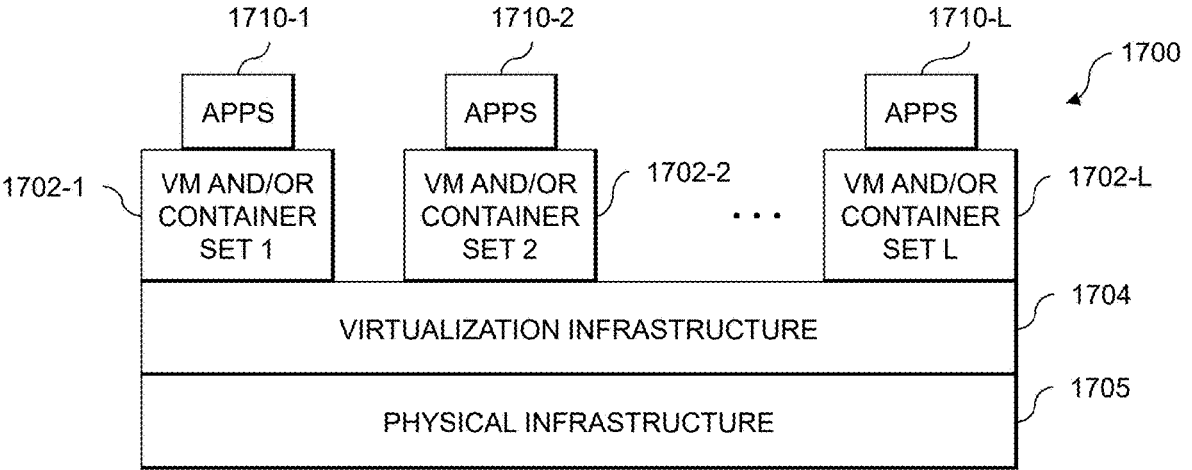
FIGS. 17 and 18 show examples of processing platforms that may be utilized to implement at least a portion of an information processing system in illustrative embodiments.
Figure 18:
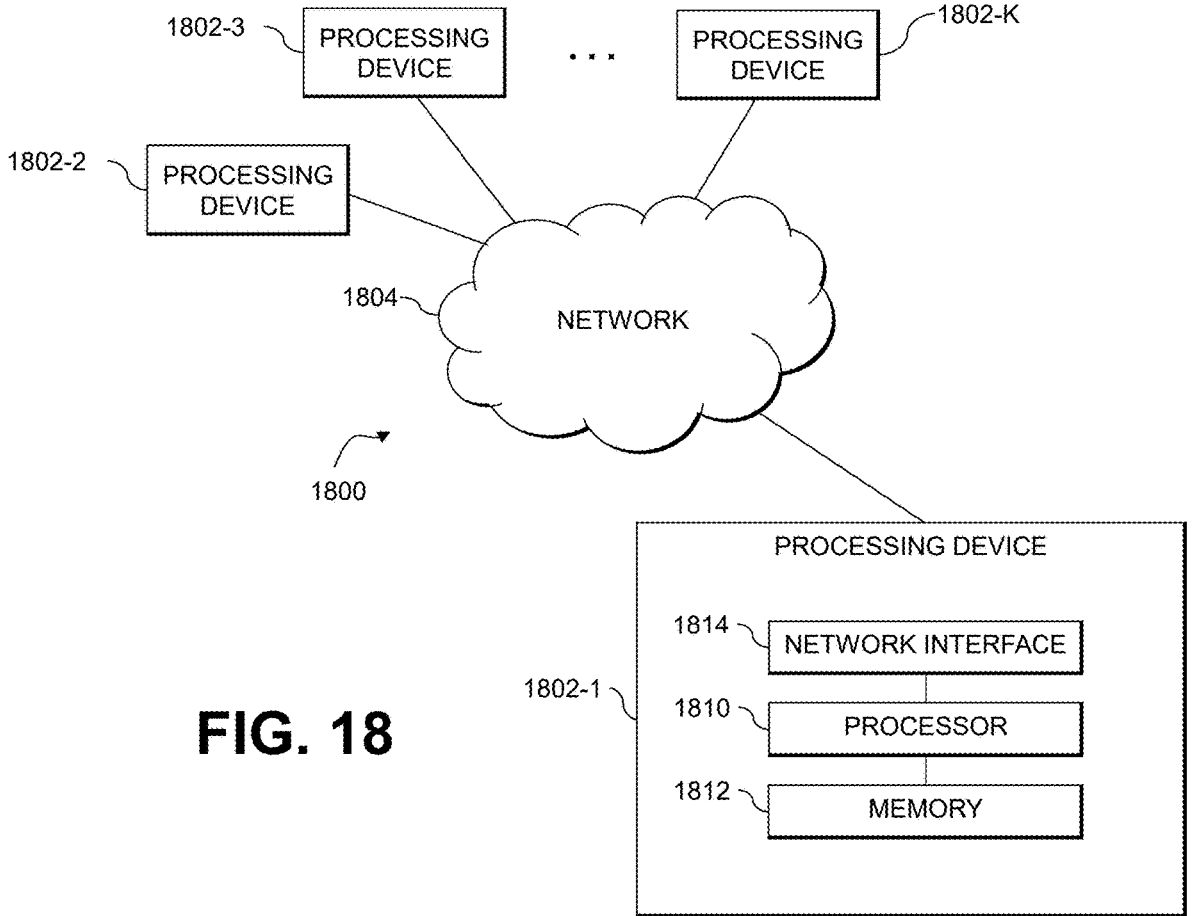

FIG. 17 shows an example processing platform comprising cloud infrastructure 1700. The cloud infrastructure 1700 comprises a combination of physical and virtual processing resources that may be utilized to implement at least a portion of the information processing system 100 in FIG. 1. The cloud infrastructure 1700 comprises multiple virtual machines (VMs) and/or container sets 1702-1, 1702-2, . . . 1702-L implemented using virtualization infrastructure 1704. The virtualization infrastructure 1704 runs on physical infrastructure 1705, and illustratively comprises one or more hypervisors and/or operating system level virtualization infrastructure. The operating system level virtualization infrastructure illustratively comprises kernel control groups of a Linux operating system or other type of operating system.

The cloud infrastructure 1700 further comprises sets of applications 1710-1, 1710-2, . . . 1710-L running on respective ones of the VMs/container sets 1702-1, 1702-2, . . . 1702-L under the control of the virtualization infrastructure 1704. The VMs/container sets 1702 may comprise respective VMs, respective sets of one or more containers, or respective sets of one or more containers running in VMs.

In some implementations of the FIG. 17 embodiment, the VMs/container sets 1702 comprise respective VMs implemented using virtualization infrastructure 1704 that comprises at least one hypervisor. A hypervisor platform may be used to implement a hypervisor within the virtualization infrastructure 1704, where the hypervisor platform has an associated virtual infrastructure management system. The underlying physical machines may comprise one or more distributed processing platforms that include one or more storage systems.

In other implementations of the FIG. 17 embodiment, the VMs/container sets 1702 comprise respective containers implemented using virtualization infrastructure 1704 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1700 shown in FIG. 17 may represent at least a portion of one processing platform. Another example of such a processing platform is processing platform 1800 shown in FIG. 18.

The processing platform 1800 in this embodiment comprises a portion of system 100 and includes a plurality of processing devices, denoted 1802-1, 1802-2, 1802-3, . . . 1802-K, which communicate with one another over a network 1804.

The network 1804 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1802-1 in the processing platform 1800 comprises a processor 1810 coupled to a memory 1812.

The processor 1810 may comprise a microprocessor, a microcontroller, an application-specific integrated circuit (ASIC), a field-programmable gate array (FPGA), a central processing unit (CPU), a graphics processing unit (GPU), a tensor processing unit (TPU), a video processing unit (VPU), a neural processing unit (NPU), a data processing unit (DPU), a System-On-Chip (SOC) or other type of processing circuitry, as well as portions or combinations of such circuitry elements.

The memory 1812 may comprise random access memory (RAM), read-only memory (ROM), flash memory or other types of memory, in any combination. The memory 1812 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1802-1 is network interface circuitry 1814, which is used to interface the processing device with the network 1804 and other system components, and may comprise conventional transceivers.

The other processing devices 1802 of the processing platform 1800 are assumed to be configured in a manner similar to that shown for processing device 1802-1 in the figure.

Again, the particular processing platform 1800 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for machine learning-based processing of logs containing unstructured text data as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, IT assets, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:

at least one processing device comprising a processor coupled to a memory;

the at least one processing device being configured:

to obtain a plurality of logs associated with operation of one or more information technology assets in an information technology infrastructure environment, the plurality of logs comprising unstructured text data characterizing one or more issues encountered on the one or more information technology assets in the information technology infrastructure environment;

to generate, utilizing a transformer-based machine learning model, embeddings for the plurality of logs;

to select, based at least in part on one or more cluster validation metrics determined by processing the embeddings for the plurality of logs, a target number of clusters;

to determine, utilizing a machine learning-based clustering model that takes as input the target number of clusters, a set of clusters for the plurality of logs;

to determine a prioritization of the one or more issues encountered on the one or more information technology assets in the information technology infrastructure environment based at least in part on identifying associations between respective ones of the clusters in the determined set of clusters and at least one of (i) applications executing on the one or more information technology assets in the information technology infrastructure environment and (ii) users of the applications executing on the one or more information technology assets in the information technology infrastructure environment; and to remediate the one or more issues encountered on the one or more information technology assets in the information technology infrastructure environment based at least in part on the determined prioritization.

2. The apparatus of claim 1 wherein the at least one processing device is further configured, prior to generating the embeddings for the plurality of logs, to apply data preprocessing to the unstructured text data of the plurality logs.

3. The apparatus of claim 2 wherein the data preprocessing comprises at least one of removing noise from the unstructured text data, tokenizing the unstructured text data, and standardizing a data format of the unstructured text data.

4. The apparatus of claim 1 wherein the transformer-based machine learning model comprises a large language model that generates, for each log in the plurality of logs, fixed-length vector representations for each of one or more portions of the unstructured text data in that log.

5. The apparatus of claim 1 wherein generating the embeddings for the plurality of logs further comprises utilizing an autoencoder-based machine learning model to reduce a dimensionality of the embeddings output by the transformer-based machine learning model.

6. The apparatus of claim 5 wherein the autoencoder-based machine learning model comprises a multilayer stacked autoencoder comprising an encoder configured to compress input data to a lower-dimensional representation and a decoder configured to reconstruct the input data.

7. The apparatus of claim 1 wherein the one or more cluster validation metrics comprise silhouette scores, and wherein selecting the target number of clusters comprises selecting a number of clusters with a maximum silhouette score.

8. The apparatus of claim 1 wherein the machine learning-based clustering model comprises a K-means clustering model, where K is the selected target number of clusters.

9. The apparatus of claim 1 wherein the machine learning-based clustering model comprises at least one of an agglomerative clustering model and a mean-shift clustering model.

10. The apparatus of claim 1 wherein the at least one processing device is further configured to generate natural language text summaries for each of at least a subset of the determined set of clusters by processing unstructured text data of the subset of the determined set of clusters utilizing a large language model.

11. The apparatus of claim 10 wherein remediating the one or more issues encountered on the one or more information technology assets in the information technology infrastructure environment based at least in part on the determined prioritization comprises utilizing the generated natural language text summaries to identify one or more root causes of at least one of the one or more issues encountered on the one or more information technology assets in the information technology infrastructure environment.

12. The apparatus of claim 1 wherein determining the prioritization of the one or more issues encountered on the one or more information technology assets in the information technology infrastructure environment comprises generating a heatmap visualization characterizing the identified associations between respective ones of the clusters in the determined set of clusters and said at least one of (i) the applications executing on the one or more information technology assets in the information technology infrastructure environment and (ii) the users of the applications executing on the one or more information technology assets in the information technology infrastructure environment.

13. The apparatus of claim 1 wherein the plurality of logs comprise authentication logs, and the determined set of clusters are associated with input texts for different types of potentially malicious login attempts for the information technology assets in the information technology infrastructure environment.

14. The apparatus of claim 1 wherein the plurality of logs comprise user interaction data with an online platform operated by an organization, and the determined set of clusters are associated with different types of fraud in user interactions with the online platform operated by the organization.

15. A computer program product comprising a non-transitory processor-readable storage medium having stored therein program code of one or more software programs, wherein the program code when executed by at least one processing device causes the at least one processing device:

to obtain a plurality of logs associated with operation of one or more information technology assets in an information technology infrastructure environment, the plurality of logs comprising unstructured text data characterizing one or more issues encountered on the one or more information technology assets in the information technology infrastructure environment;

to generate, utilizing a transformer-based machine learning model, embeddings for the plurality of logs;

to select, based at least in part on one or more cluster validation metrics determined by processing the embeddings for the plurality of logs, a target number of clusters;

to determine, utilizing a machine learning-based clustering model that takes as input the target number of clusters, a set of clusters for the plurality of logs;

to determine a prioritization of the one or more issues encountered on the one or more information technology assets in the information technology infrastructure environment based at least in part on identifying associations between respective ones of the clusters in the determined set of clusters and at least one of (i) applications executing on the one or more information technology assets in the information technology infrastructure environment and (ii) users of the applications executing on the one or more information technology assets in the information technology infrastructure environment; and to remediate the one or more issues encountered on the one or more information technology assets in the information technology infrastructure environment based at least in part on the determined prioritization.

16. The computer program product of claim 15 wherein generating the embeddings for the plurality of logs further comprises utilizing an autoencoder-based machine learning model to reduce a dimensionality of the embeddings output by the transformer-based machine learning model.

17. The computer program product of claim 15 wherein the program code when executed by the at least one processing device further causes the at least one processing device to generate natural language text summaries for each of at least a subset of the determined set of clusters by processing unstructured text data of the subset of the determined set of clusters utilizing a large language model.

18. A method comprising:

obtaining a plurality of logs associated with operation of one or more information technology assets in an information technology infrastructure environment, the plurality of logs comprising unstructured text data characterizing one or more issues encountered on the one or more information technology assets in the information technology infrastructure environment;

generating, utilizing a transformer-based machine learning model, embeddings for the plurality of logs;

selecting, based at least in part on one or more cluster validation metrics determined by processing the embeddings for the plurality of logs, a target number of clusters;

determining, utilizing a machine learning-based clustering model that takes as input the target number of clusters, a set of clusters for the plurality of logs;

determining a prioritization of the one or more issues encountered on the one or more information technology assets in the information technology infrastructure environment based at least in part on identifying associations between respective ones of the clusters in the determined set of clusters and at least one of (i) applications executing on the one or more information technology assets in the information technology infrastructure environment and (ii) users of the applications executing on the one or more information technology assets in the information technology infrastructure environment; and remediating the one or more issues encountered on the one or more information technology assets in the information technology infrastructure environment based at least in part on the determined prioritization;

wherein the method is performed by at least one processing device comprising a processor coupled to a memory.

19. The method of claim 18 wherein generating the embeddings for the plurality of logs further comprises utilizing an autoencoder-based machine learning model to reduce a dimensionality of the embeddings output by the transformer-based machine learning model.

20. The method of claim 18 further comprising generating natural language text summaries for each of at least a subset of the determined set of clusters by processing unstructured text data of the subset of the determined set of clusters utilizing a large language model.

* * * * *